United States Patent
Cai et al.

(10) Patent No.: US 11,659,709 B2
(45) Date of Patent: May 23, 2023

(54) SINGLE WELL ONE TRANSISTOR AND ONE CAPACITOR NONVOLATILE MEMORY DEVICE AND INTEGRATION SCHEMES

(71) Applicant: GLOBALFOUNDRIES Singapore Pte. Ltd., Singapore (SG)

(72) Inventors: Xinshu Cai, Singapore (SG); Shyue Seng Tan, Singapore (SG); Juan Boon Tan, Singapore (SG); Kiok Boone Elgin Quek, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/999,067

(22) Filed: Aug. 21, 2020

(65) Prior Publication Data
US 2022/0059554 A1   Feb. 24, 2022

(51) Int. Cl.
| | |
|---|---|
| H01L 27/11521 | (2017.01) |
| H01L 29/66 | (2006.01) |
| H01L 49/02 | (2006.01) |
| H01L 29/788 | (2006.01) |
| H01L 29/06 | (2006.01) |

(52) U.S. Cl.
CPC ........ *H01L 27/11521* (2013.01); *H01L 28/60* (2013.01); *H01L 29/0653* (2013.01); *H01L 29/66825* (2013.01); *H01L 29/7884* (2013.01)

(58) Field of Classification Search
CPC ........... H01L 27/11521; H01L 29/7884; H01L 29/0653; H01L 29/66825
See application file for complete search history.

(56) References Cited

U.S. PATENT DOCUMENTS

| | | | | |
|---|---|---|---|---|
| 5,552,621 A | * | 9/1996 | Kowalski | H01L 29/94 257/E29.345 |
| 5,903,026 A | * | 5/1999 | Gonzalez | H01L 27/10808 257/314 |
| 6,090,697 A | * | 7/2000 | Xing | H01L 21/31116 257/E21.009 |
| 7,099,192 B2 | | 8/2006 | Wang et al. | |
| 7,615,820 B2 | * | 11/2009 | Yuan | H01L 27/11521 257/E27.06 |

(Continued)

OTHER PUBLICATIONS

Lee et al., Effect of MIM and n-Well Capacitors on Programming Characteristics of EEPROM, Transactions on Electrical and Electronic Materials, Feb. 2011, pp. 35-39, vol. 12, No. 1, KIEEME.

*Primary Examiner* — Eugene Lee
(74) *Attorney, Agent, or Firm* — David Cain

(57) ABSTRACT

A nonvolatile memory device is provided. The nonvolatile memory device comprises an active region surrounded by an isolation structure. A floating gate may be arranged over the active region, the floating gate having a first end and a second end over the isolation structure. A first doped region may be provided in the active region adjacent to a first side of the floating gate and a second doped region may be provided in the active region adjacent to a second side of the floating gate. A first capacitor may be provided over the floating gate, whereby a first electrode of the first capacitor is electrically coupled to the floating gate. A second capacitor may be provided, whereby a first electrode of the second capacitor is over the isolation structure and adjacent to the floating gate.

20 Claims, 9 Drawing Sheets

(56) References Cited

U.S. PATENT DOCUMENTS

| | | | | |
|---|---|---|---|---|
| 8,551,839 B2* | 10/2013 | Higashitani | H01L 21/76232 | 438/257 |
| 2002/0005543 A1* | 1/2002 | Di Pede | H01L 27/11521 | 257/314 |
| 2003/0030089 A1* | 2/2003 | Sumino | H01L 21/76229 | 257/E21.654 |
| 2004/0099893 A1* | 5/2004 | Martin | H01L 27/11507 | 257/295 |
| 2004/0140510 A1* | 7/2004 | Hazama | H01L 29/7881 | 257/390 |
| 2006/0124988 A1* | 6/2006 | Hur | H01L 27/115 | 257/315 |
| 2006/0128099 A1* | 6/2006 | Kim | H01L 27/11521 | 438/257 |
| 2007/0111441 A1* | 5/2007 | Koh | H01L 29/42324 | 438/257 |
| 2007/0262372 A1* | 11/2007 | Yamamoto | H01L 29/42336 | 257/E27.103 |
| 2008/0006868 A1* | 1/2008 | Hsu | H01L 27/115 | 257/314 |
| 2008/0138950 A1* | 6/2008 | Fang | H01L 27/11521 | 438/257 |
| 2009/0080257 A1* | 3/2009 | Oka | G11C 5/025 | 365/185.13 |
| 2011/0121373 A1* | 5/2011 | Lin | H01L 27/0629 | 257/296 |
| 2014/0167127 A1* | 6/2014 | Kalnitsky | G11C 16/0441 | 257/298 |
| 2018/0005668 A1* | 1/2018 | Shionoiri | H01L 27/1255 | |
| 2020/0075612 A1* | 3/2020 | Sogawa | H01L 21/823857 | |
| 2021/0305265 A1* | 9/2021 | Tian | H01L 28/40 | |

* cited by examiner

View B-B'

View C-C'

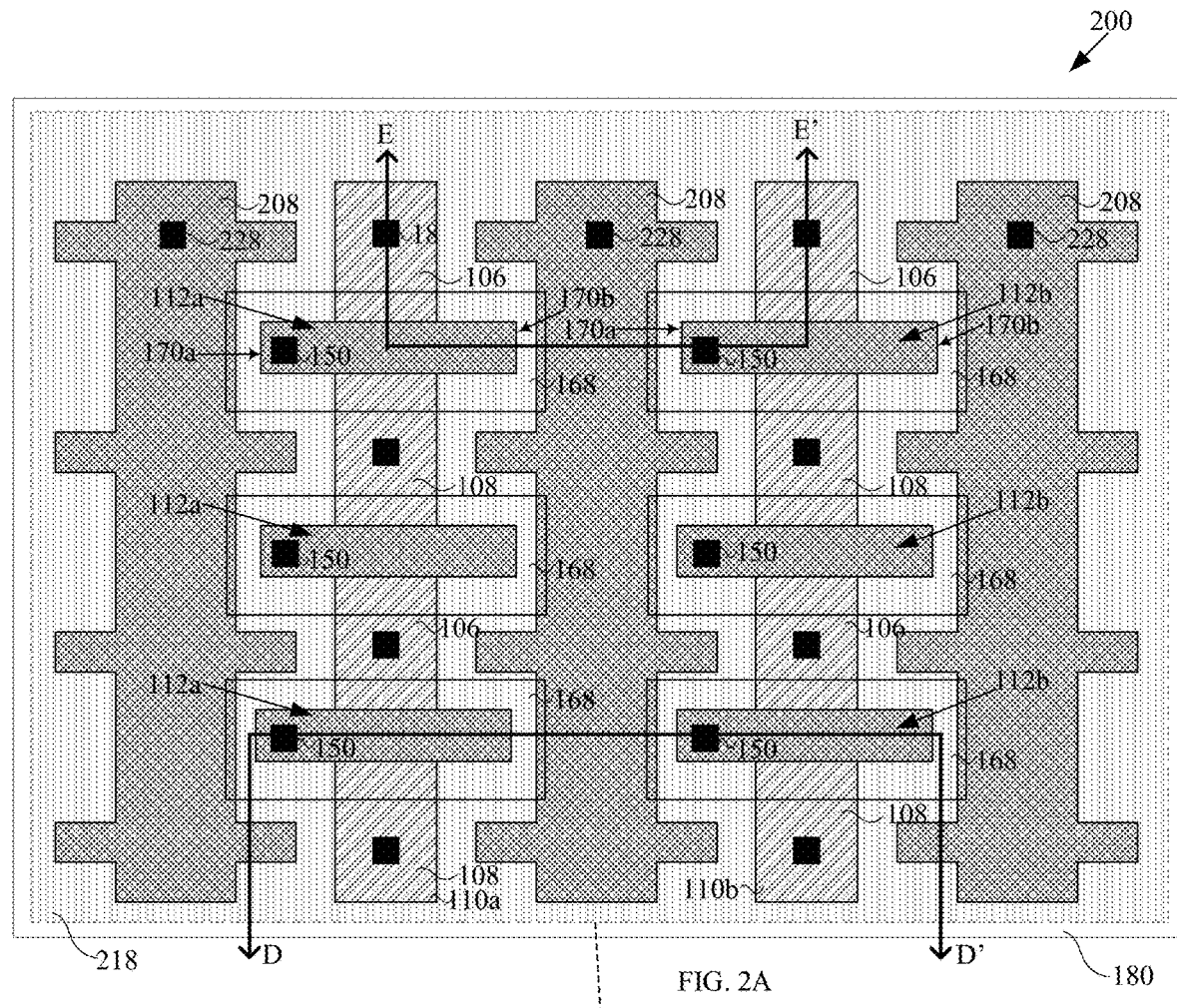
FIG. 2A
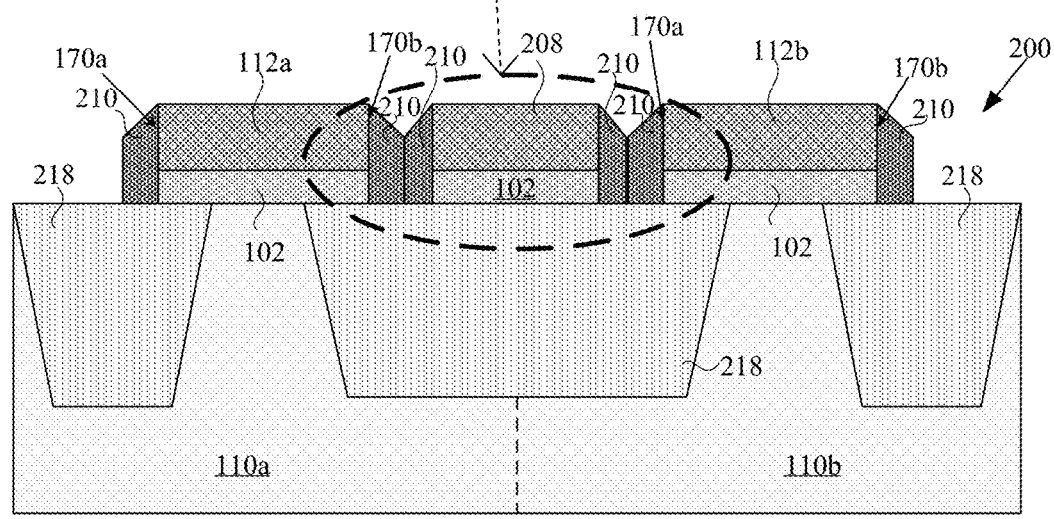
View D-D'  FIG. 2B

View A-A'

View A-A'

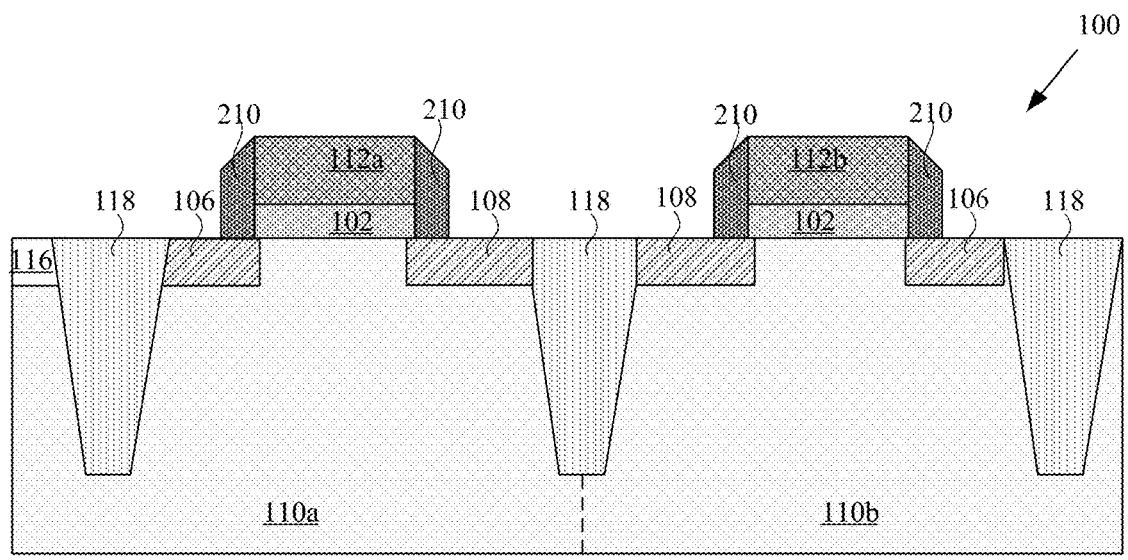
View A-A'  FIG. 5
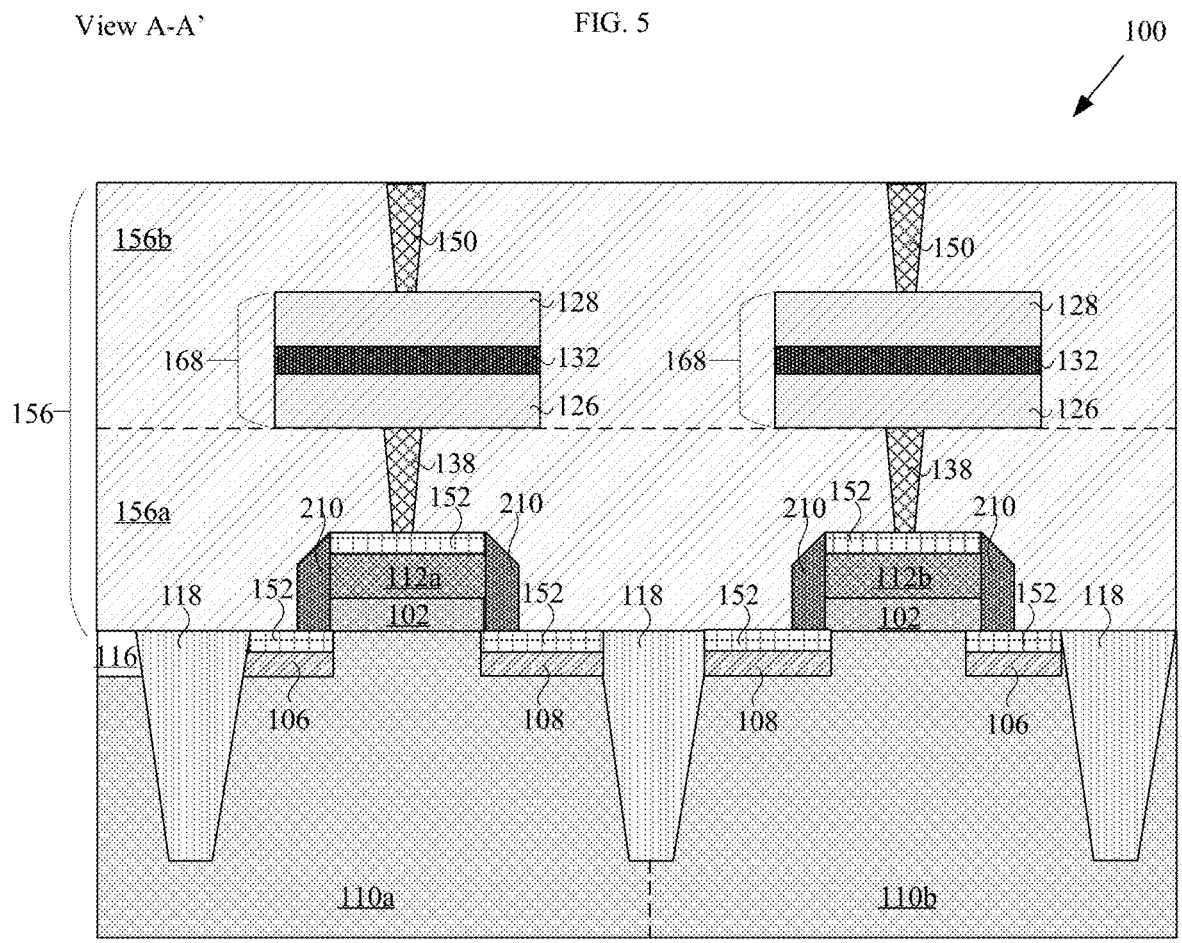
View A-A'  FIG. 6

View E-E'

View E-E'

SINGLE WELL ONE TRANSISTOR AND ONE CAPACITOR NONVOLATILE MEMORY DEVICE AND INTEGRATION SCHEMES

FIELD OF THE INVENTION

The disclosed embodiments relate generally to nonvolatile memory devices, and more particularly, to nonvolatile memory devices with high density, a compact size and improved reliability.

BACKGROUND

A nonvolatile memory device retains stored data even if power is turned off. An example of a nonvolatile memory device includes electrically erasable programmable read only memory (EEPROM) and flash EEPROM. In typical flash memory architecture, a floating gate may be used to store charges. The floating gate may be arranged over an active region such as a p-well. A source region may be formed in the p-well adjacent to a first side of the floating gate and a drain region may be formed in the p-well adjacent to a second side of the floating gate. An n-well capacitor adjacent to the floating gate may be used to bias the floating gate. The n-well capacitor may comprise a polysilicon layer over an n-well and a highly doped n+ region as an input terminal. An isolation structure may separate the n-well from an adjacent p-well.

Programming may be by hot electron injection. For example, during program, a high voltage above 9V may be applied to the n-well capacitor to bias the floating gate and to the drain region. A moderate voltage, for example 4V, may be applied to the source region and a substrate terminal of the memory device may be grounded. A strong vertically oriented electric field may be generated across a channel region between the source and the drain resulting in injection of hot electrons to an edge portion of the floating gate near the drain. Erasing may be by hot hole injection. For example, during erase, a high voltage above 9V may be applied to the drain. The n-well capacitor, the source and the substrate terminal may be grounded. Electron hole pairs may be generated in the drain region by band to band tunneling (BTB). The generated holes may be accelerated by a lateral electric field toward the channel region between the source and the drain and some of them may obtain high energy. The hot holes may be injected into the floating gate and recombine with the electrons stored in the floating gate.

The high program and erase voltages may lead to increased stress on a dielectric layer between the floating gate and the channel region resulting in poorer reliability. The erase mechanism is inefficient as a negative voltage may not be applied to the n-well capacitor. A negative voltage may induce unwanted forward bias current between the n-well capacitor and the adjacent p-well. The n-well capacitor results in a larger lateral size of the memory device preventing further scaling of the memory device. Thus, there is an urgent need to overcome the challenges mentioned above.

SUMMARY

In an aspect of the present disclosure, a nonvolatile memory device is provided. The nonvolatile memory device comprises an active region surrounded by an isolation structure. A floating gate may be arranged over the active region, the floating gate having a first end and a second end over the isolation structure. A first doped region may be arranged in the active region adjacent to a first side of the floating gate and a second doped region may be arranged in the active region adjacent to a second side of the floating gate. A first capacitor may be arranged over the floating gate, whereby a first electrode of the first capacitor is electrically coupled to the floating gate.

In another aspect of the present disclosure, an array of nonvolatile memory devices is provided. The array of nonvolatile memory devices comprises a first active region, a second active region and an isolation structure surrounding each active region, whereby a portion of the isolation structure is between the first active region and the second active region. A first array of floating gates over the first active region and a second array of floating gates over the second active region, whereby a first end and a second end of each floating gate are over the isolation structure. A first doped region in each active region adjacent to a first side of each floating gate and a second doped region in each active region adjacent to a second side of each floating gate. A first capacitor over each floating gate, whereby a first electrode of the first capacitor is electrically coupled to each floating gate.

In yet another aspect of the present disclosure, a method of fabricating a nonvolatile memory device is provided. The method comprises providing an active region surrounded by an isolation structure. A floating gate may be provided over the active region, whereby a first end and a second end of the floating gate are over the isolation structure. A first doped region may be provided in the active region adjacent to a first side of the floating gate and a second doped region may be provided in the active region adjacent to a second side of the floating gate. A first capacitor may be provided over the floating gate, whereby a first electrode of the first capacitor is electrically coupled to the floating gate.

Numerous advantages may be derived from the embodiments described below. The embodiments provide a compact nonvolatile memory device with a high coupling ratio, a high density and improved reliability.

BRIEF DESCRIPTION OF THE DRAWINGS

The disclosed embodiments will be better understood from a reading of the following detailed description, taken in conjunction with the accompanying drawings:

FIG. 2A is a top view of a nonvolatile memory device array, according to another embodiment of the disclosure.

FIG. 2B is a cross-section view of a nonvolatile memory device array taken along section line D-D' of FIG. 2A, according to an embodiment of the disclosure.

FIGS. 3 to 6 illustrate a fabrication process flow for the array of nonvolatile memory devices illustrated in FIG. 1A, according to some embodiments of the disclosure.

Figure 1A:
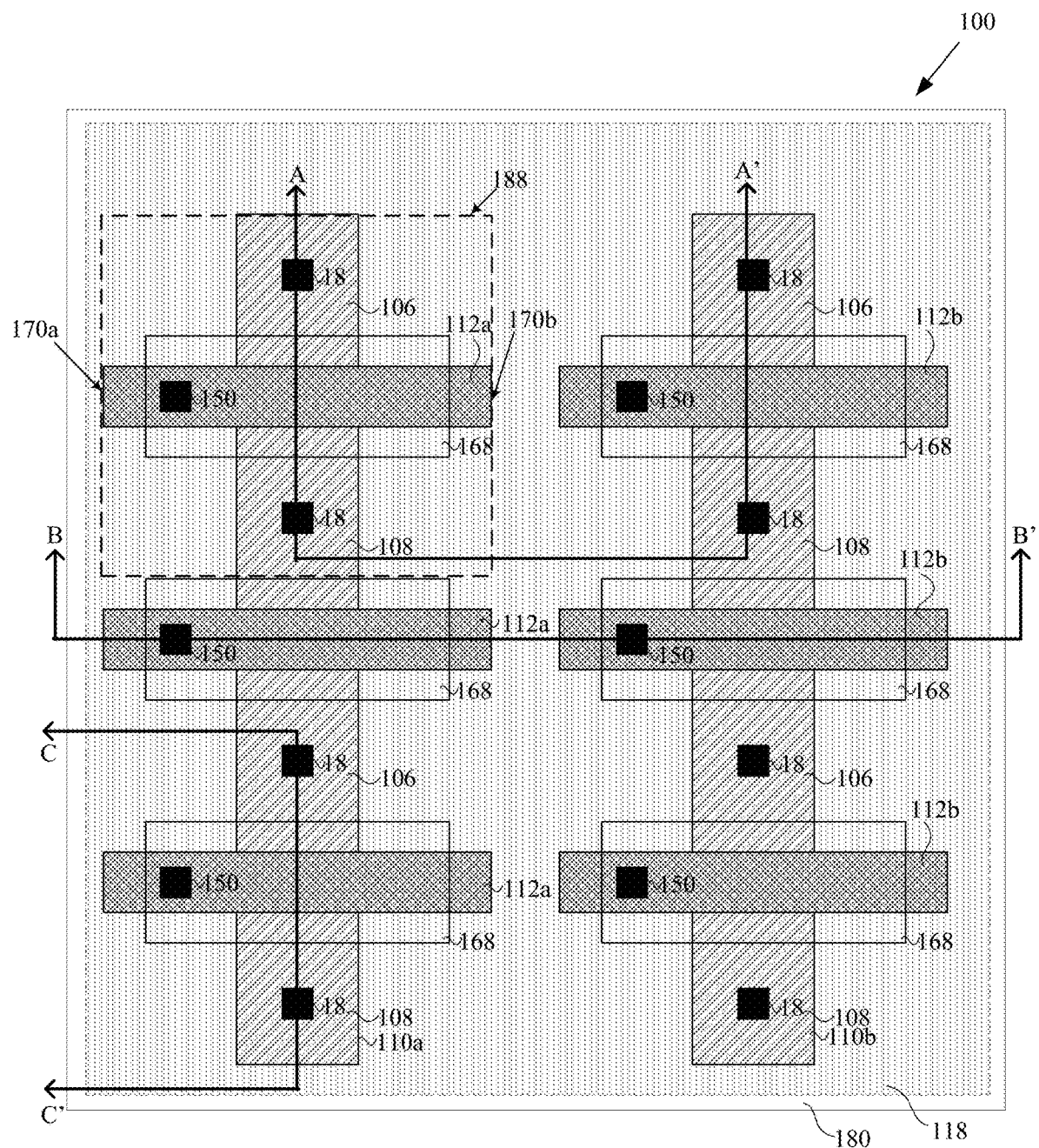
FIG. 1A is a top view of a nonvolatile memory device array, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A is a top view of a nonvolatile memory device array 100, according to an embodiment of the disclosure. Referring to FIG. 1A, the nonvolatile memory device array 100 comprises a first active region 110a and a second active region 110b and an isolation structure 118 surrounding each active region, 110a and 110b. The isolation structure 118 is shown as a dashed outline. In an embodiment, the isolation structure 118 may be shallow trench isolation (STI). A portion of the isolation structure 118 is between the first active region 110a and the second active region 110b. The isolation structure 118 and the active regions 110a and 110b may be formed in a semiconductor substrate 180. The first active region 110a and the second active region 110b may collectively be referred to as active regions 110.

A first array of floating gates 112a may be provided over the first active region 110a and a second array of floating gates 112b may be provided over the second active region 110b. The first array of floating gates 112a and the second array of floating gates 112b may be collectively referred to as floating gates 112. Each floating gate 112 may have a first end 170a and a second end 170b opposite to the first end. The first end 170a and the second end 170b of each floating gate 112 may be arranged over the isolation structure 118. A first doped region 106 may be provided in each active region, 110a and 110b, adjacent to a first side of each floating gate 112 and a second doped region 108 may be provided in each active region, 110a and 110b, adjacent to a second side of each floating gate 112 opposite to the first side. For example, the first doped region 106 may be a source and the second doped region 108 may be a drain of the nonvolatile memory device array 100. A contact 18 may be provided over the source 106 and the drain 108 for connection to an external input terminal. The term "floating gate" may refer to a gate electrode that is electrically isolated from an input terminal and may be capacitively coupled to the input terminal. There is no direct current flowing from the input terminal to the floating gate during device operation. A first capacitor 168 may be provided over each floating gate 112, thereby providing a compact design for the nonvolatile memory array 100. A contact 150 may electrically couple the first capacitor 168 to an external input terminal. The first capacitor 168 may have an area that is at least equal to or larger than an area of each floating gate 112. In an embodiment, the first capacitor 168 may be a metal insulator metal (MIM) capacitor. In another embodiment, the first capacitor 168 may be a metal oxide metal (MOM) capacitor. Although not shown, the nonvolatile memory device array 100 may include a substrate contact.

Each active region 110a and 110b may be a p-well. Each floating gate 112 over each active region 110a and 110b and a source 106 and a drain 108 adjacent to a first side and to a second side of each floating gate 112, respectively, may operate as a standalone nonvolatile memory transistor 188. An advantage of the nonvolatile memory device array 100 is its compact design as a single p-well is used for each standalone nonvolatile memory transistor 188. The source 106 and the drain 108 may be arranged in an alternating fashion along each active region 110a and 110b, with each floating gate 112 sharing a source 106 or a drain 108 with a neighboring floating gate 112. In an embodiment, the source 106 and the drain 108 may be structurally identical. For example, in an embodiment, the source 106 and the drain 108 may have identical doping regions. In another embodiment, the source 106 and the drain 108 may be structurally different. For example, the drain 108 may have a deeper doping region compared to the source 106.

Figure 1B:
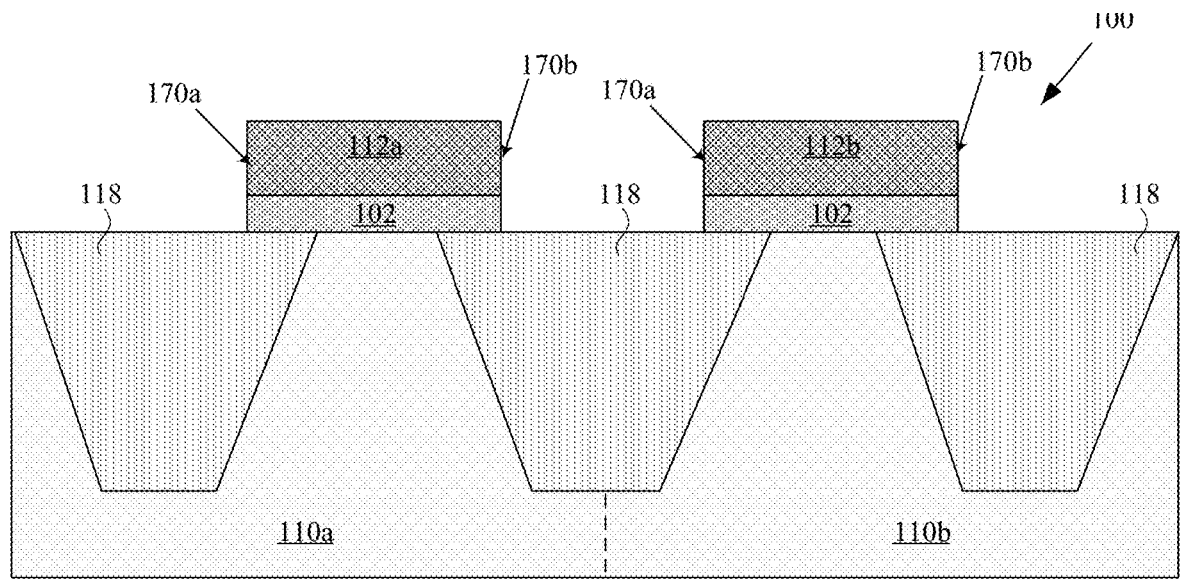
FIG. 1B is a cross-section view of a nonvolatile memory device array taken along section line B-B' of FIG. 1A, according to an embodiment of the disclosure.

FIG. 1B is a cross-section view of a nonvolatile memory device array 100 taken along section line B-B' of FIG. 1A, according to embodiments of the disclosure. Referring to FIG. 1B, a first floating gate 112a and a second floating gate 112b are arranged over a first active region 110a and a second active region 110b, respectively. The first end 170a and the second end 170b of the first floating gate 112a and the second floating gate 112b are arranged over the isolation structure 118. An advantage of having the first end 170a and the second end 170b of the first floating gate 112a and the second floating gate 112b over the isolation structure 118 is allowing tolerance in the alignment and patterning of the first floating gate 112a and the second floating gate 112b. For simplicity, the first capacitor 168 is not shown in this cross-section.

Figure 1C:
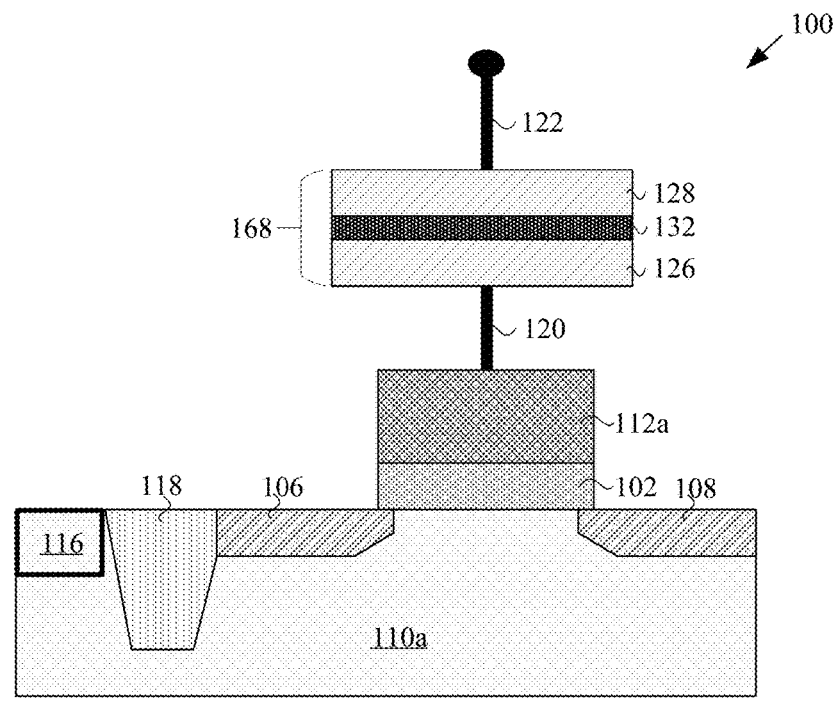
FIG. 1C is a simplified schematic view of a nonvolatile memory device along section line C-C' of FIG. 1A, according to an embodiment of the disclosure.

FIG. 1C is a simplified schematic view of a nonvolatile memory device 100 taken along section line C-C' of FIG. 1A, according to an embodiment of the disclosure. Referring to FIG. 1C, a first floating gate 112a may be provided over a first active region 110a. A dielectric layer 102 may be provided between the first floating gate 112a and the first active region 110a. A source 106 may be formed in the first active region 110a adjacent to a first side of the first floating gate 112a. A drain 108 may be formed in the first active region 110a adjacent to a second side of the first floating gate 112a opposite to the source 106. An isolation structure 118 may be formed in the first active region 110a adjacent to the source 106 or the drain 108. A substrate contact 116 may be formed in an upper surface of the first active region 110a adjacent to the isolation structure 118. For simplicity, the substrate contact 116 is not shown in FIG. 1A. A first capacitor 168 may be provided over the first floating gate 112a. A line 120 indicates an electrical coupling between a first electrode 126 of the first capacitor 168 to the first floating gate 112a. A dielectric layer 132 may be provided over the first electrode 126. A second electrode 128 may be provided over the dielectric layer 132. A line 122 indicates an electrical coupling between the second electrode 128 of the first capacitor 168 and an external input terminal.

Figure 1D:
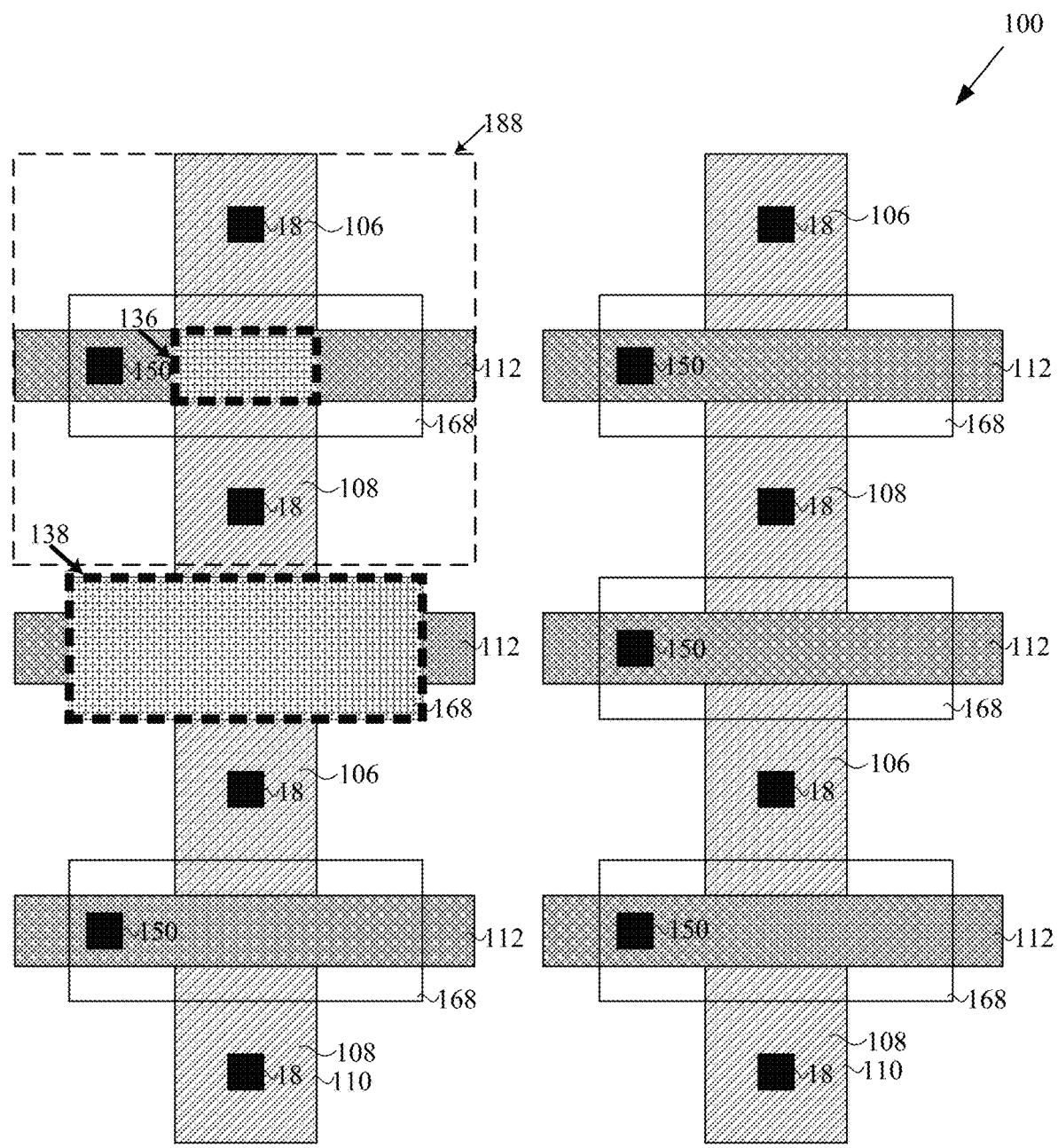
FIG. 1D is a top view of a nonvolatile memory device array showing a portion of an active region below a floating gate and an area of a first capacitor, according to an embodiment of the disclosure.

FIG. 1D is a top view of a nonvolatile memory device array 100 showing a portion 136 of an active region 110 below a floating gate 112 and an area 138 of a first capacitor 168, according to an embodiment of the disclosure. A floating gate capacitance $C_{112}$ is equal to an area $A_{136}$ of the portion 136 of the active region 110 below the floating gate 112 multiplied by a ratio of a dielectric constant, $\varepsilon_{102}$, of a dielectric layer 102 between the floating gate 112 and the active region 110 to a thickness $T_{102}$ of the dielectric layer 102. $C_{112}=A_{136}\times\varepsilon_{102}/T_{102}$. A first capacitor capacitance $C_{168}$ is equal to an area 138, $A_{138}$, of the first capacitor 168, multiplied by a ratio of a dielectric constant, $\varepsilon_{132}$, of a dielectric layer 132 of the first capacitor 168 to a thickness $T_{132}$ of the dielectric layer 132. $C_{168}=A_{138}\times\varepsilon_{132}/T_{132}$. A coupling ratio of the nonvolatile memory device array 100 is equal to the first capacitor capacitance, $C_{168}$ divided by the sum of the first capacitor capacitance, $C_{168}$ and the floating gate capacitance, $C_{112}$. Thereby, the coupling ratio of the nonvolatile memory device array $100=C_{168}/(C_{168}+C_{112})$. The term "coupling ratio" may indicate the voltage transfer capability from the first capacitor 168 to the floating gate 112. The coupling ratio of the nonvolatile memory device array 100 may be increased by increasing the first capacitor capacitance $C_{168}$ or by decreasing the floating gate capacitance $C_{112}$. For example, the coupling ratio of the nonvolatile memory device array 100 may be increased by increasing the area 138, $A_{138}$, of the first capacitor 168, or the dielectric constant, $\varepsilon_{132}$, of the dielectric layer 132 of the first capacitor 168. For example, the area 138, $A_{138}$, of the first capacitor 168 is larger than the area $A_{136}$ of the portion 136 of the active region 110 below the floating gate 112 thereby providing a high coupling ratio.

An exemplary set of biasing conditions for an embodiment of the nonvolatile memory device array 100 shown in FIG. 1A is listed in Table 1. Programming may be by hot electron injection. For example, during program, a suitable voltage of approximately 3 to 8V may be applied to the first capacitor 168 and to the drain 108 of a selected nonvolatile memory transistor 188. A suitable voltage of approximately 3V may be applied to a source 106 of the selected nonvolatile memory transistor 188 and a substrate terminal may be grounded. An inhibit voltage of approximately 4 to 8V may be applied to a source 106 of an unselected memory transistor 188 to prevent electron injection to a floating gate 112 of the unselected nonvolatile memory transistor 188. A first capacitor 168, a drain 108 and a substrate terminal of the unselected nonvolatile memory transistor 188 may be grounded. A strong vertically oriented electric field may be generated across a channel region between the source 106 and the drain 108 of the selected nonvolatile memory transistor 188 resulting in injection of hot electrons to an edge portion of the floating gate 112 near the drain 108.

selected nonvolatile memory transistor 188. The source 106 and the substrate terminal of the selected nonvolatile memory transistor 188 may be grounded. A current may be detected at the drain 108 depending on a threshold voltage of the selected nonvolatile memory transistor 188. For example, the threshold voltage of the selected nonvolatile memory transistor 188 is low after erase and a current may be detected at the drain 108. A program operation may lead to a high threshold voltage of the selected nonvolatile memory transistor 188 and less current or negligible current may be detected at the drain 108. The first capacitor 168, the source 106, the drain 108 and the substrate terminal of an unselected nonvolatile memory transistor 188 are grounded.

The embodiments shown in FIGS. 1A to 1D may be modified to form alternative embodiments within the scope of the disclosure. For example, FIG. 2A is a top view of a nonvolatile memory device array 200, according to another embodiment of the disclosure. The same reference numerals used in FIGS. 1A to 1D are also used in FIG. 2A to refer to identical features. In contrast to the nonvolatile memory device array 100 shown in FIGS. 1A and 1D, the nonvolatile memory device array 200 shown in FIG. 2A includes a first electrode 208 of a second capacitor adjacent to a first floating gate 112a and to a second floating gate 112b. The first floating gate 112a is arranged over a first active region 110a and the second floating gate 112b is arranged over a second active region 110b. The first electrode 208 of the second capacitor may be arranged over an isolation structure 218 adjacent to the first floating gate 112a and to a second floating gate 112b and between the first active region 110a and the second active region 110b. A contact 228 over the first electrode 208 of the second capacitor may be electrically coupled to an input terminal.

Referring to FIG. 2A, a second electrode of the second capacitor may comprise the first floating gate 112a and the second floating gate 112b. A first capacitor 168 may be arranged over the first floating gate 112a or the second floating gate 112b. The first capacitor 168 may have an area larger than an area of the first floating gate 112a or the second floating gate 112b. The first capacitor 168 may partially overlap with the first electrode 208 of the second capacitor. The first electrode 208 of the second capacitor may be arranged between an end portion, for example, a second end portion 170b, of the first floating gate 112a and

TABLE 1

|  | first capacitor | | drain | | source | | substrate | |
| --- | --- | --- | --- | --- | --- | --- | --- | --- |
|  | Select | Unselect | Select | Unselect | Select | Unselect | Select | Unselect |
| Program | 3 to 8 V | 0 V | 3 to 8 V | 0 V | 3 V | 4 to 8 V | 0 V | 0 V |
| Erase | −2.5 V | −2.5 V | 6 to 8 V | 6 to 8 V | 0 V | 0 V | 0 V | 0 V |
| Read | 2.5 V | 0 V | 1 V | 0 V | 0 V | 0 V | 0 V | 0 V |

Erasing may be by hot hole injection. For example, during erase, a negative voltage of approximately −2.5V may be applied to the first capacitor 168 to bias the floating gate 112. A suitable voltage of approximately 6 to 8V may be applied to the drain 108. The source 106 and the substrate terminal 116 may be grounded. Hot holes may be generated in the channel region and injected into the floating gate 112 to recombine with the electrons stored in the floating gate 112. The memory device array 100 may be erased simultaneously.

During a reading operation, a positive bias of approximately 2.5V may be applied to the first capacitor 168 and approximately 1V may be applied to the drain 108 of a an end portion, for example, a first end portion 170a, of the second floating gate 112b, thereby it does not lead to an increase in lateral size of the nonvolatile memory device array 200. The second capacitor may allow independent control of the first floating gate 112a and the second floating gate 112b and lead to an increased coupling ratio, further lowering the voltage requirement for more efficient program and erase.

FIG. 2B is a cross-section view of a nonvolatile memory device array 200 taken along section line D-D' of FIG. 2A, according to an embodiment of the disclosure. Referring to FIG. 2B, a spacer dielectric 210 may be formed between the first electrode 208 of the second capacitor and the adjacent first floating gate 112a or the second floating gate 112b. The spacer dielectric 210 may be formed over sidewalls of the first electrode 208 of the second capacitor and over sidewalls of the adjacent first floating gate 112a or the second floating gate 112b. For simplicity, a first capacitor 168 over the first floating gate 112a or the second floating gate 112b is not shown in this cross-section.

Figure 3:
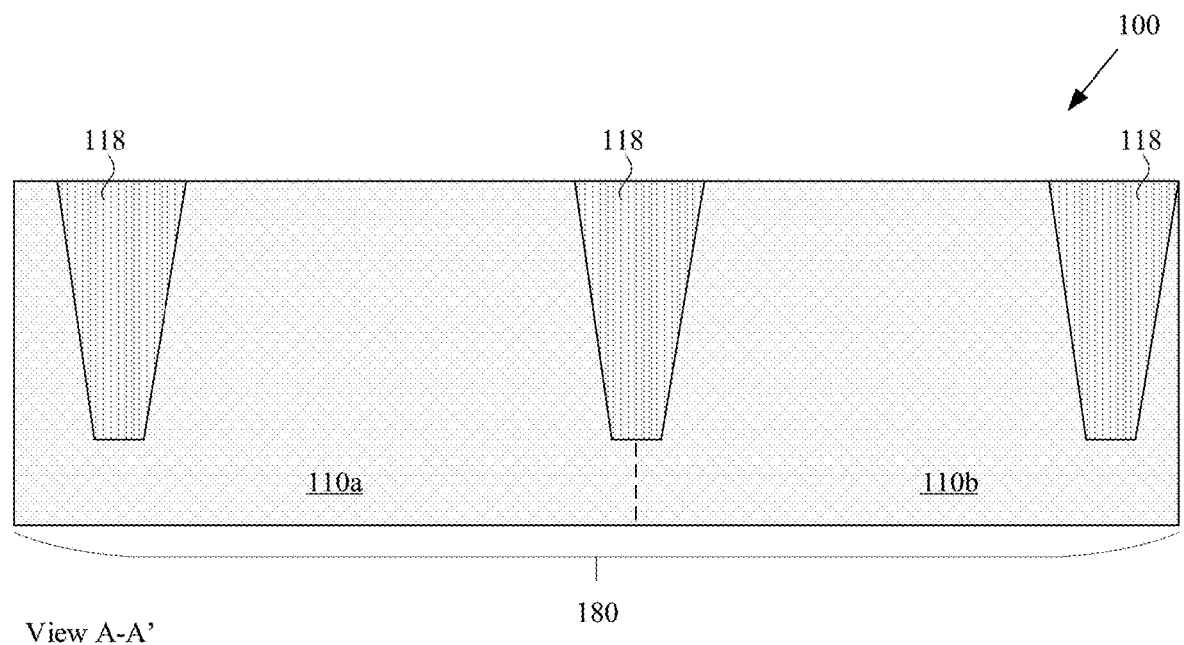

FIGS. 3 to 6 illustrate a fabrication process flow for the array of nonvolatile memory devices 100 illustrated in FIG. 1A, according to some embodiments of the disclosure. FIG. 3 is a cross-section view of a partially completed nonvolatile memory device array 100 taken along section line A-A' of FIG. 1A, according to an embodiment of the disclosure. Referring to FIG. 3, a semiconductor substrate 180 may be provided. An isolation structure 118 may be formed in the semiconductor substrate 180. The formation of the isolation structure 118 may include forming an opening in the semiconductor substrate 180 by a conventional photoresist process followed by a wet or dry etch process. A layer of photoresist may be deposited over the semiconductor substrate 180 and patterned to form a suitable photoresist pattern. A wet etch or dry etch process may be used to remove a portion of the semiconductor substrate 180 not covered by the photoresist pattern thereby forming the opening in the semiconductor substrate 180. The photoresist layer may subsequently be removed. A layer of suitable insulating material, for example silicon dioxide may be deposited into the opening in the semiconductor substrate 180 and over a top surface of the semiconductor substrate 180. A suitable planarization process, for example, chemical mechanical planarization or CMP may be used to remove the silicon dioxide layer from the top surface of the semiconductor substrate 180 leaving the silicon dioxide layer in the opening in the semiconductor substrate to thereby form the isolation structure. 118. The semiconductor substrate 180 adjacent to the isolation structure 118 may be doped by a suitable p-type dopant, for example boron (B), with an approximate doping concentration of $10^{15}$ to $10^{18}$ cm$^{-3}$, to form a p-well thereby providing a first active region 110a and a second active region 110b. The isolation structure 118 surrounds the first active region 110a and the second active region 110b thereby defining an area of the first active region 110a and the second active region 110b.

Figure 4:
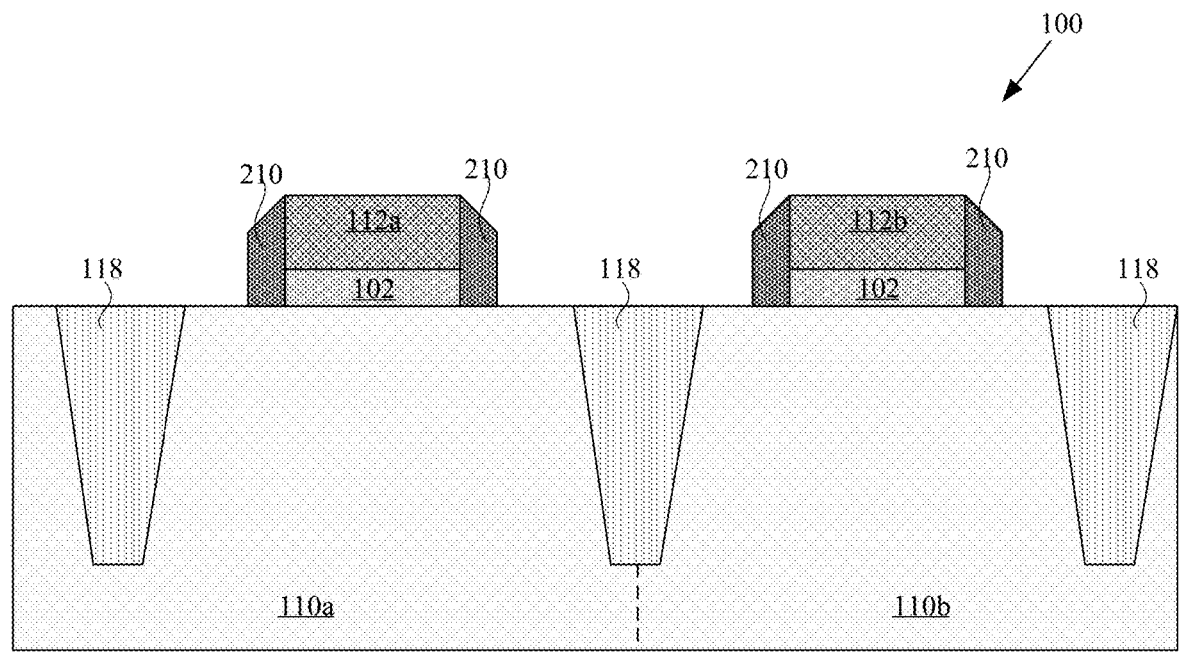

FIG. 4 is a cross-section view of a partially completed nonvolatile memory device array 100 taken along section line A-A' of FIG. 1A after formation of a dielectric layer 102, a first floating gate 112a, a second floating gate 112b and a spacer dielectric 210, according to an embodiment of the disclosure. Referring to FIG. 4, the formation of the dielectric layer 102 may include depositing a layer of suitable dielectric material, for example silicon dioxide (SiO$_2$) or hafnium dioxide (HfO$_2$), over the first active region 110a, over the second active region 110b and over the isolation structure 118. A layer of polysilicon may be deposited over the silicon dioxide layer. The polysilicon layer may be doped with phosphorus (P), arsenic (As) or antimony (Sb) to form n+-type doped polysilicon. The doped polysilicon and the silicon dioxide layer may be patterned by conventional photoresist process and a wet or dry etch process to thereby form the first floating gate 112a over the first active region 110a and the second floating gate 112b over the second active region 110b and the dielectric layer 102 between the first floating gate 112a and the first active region 110a and between the second floating gate 112b and the second active region 110b. Although not shown, an end portion 170a or 170b of the first floating gate 112a and the second floating gate 112b is formed over the isolation structure 118. A spacer dielectric 210 may be formed over sidewalls of the first floating gate 112a and the second floating gate 112b. The formation of the spacer dielectric 210 may include depositing a layer of suitable dielectric material, for example, silicon dioxide (SiO$_2$) or silicon nitride (Si$_3$N$_4$) over the sidewalls and over a top surface of the first floating gate 112a and the second floating gate 112b and over a top surface of the first active region 110a and the second active region 110b. A suitable process such as anisotropic etching may be used to remove a portion of the silicon dioxide layer from the top surface of the first floating gate 112a and the second floating gate 112b and the top surface of the first active region 110a and the second active region 110b, leaving behind another portion of the silicon dioxide layer over the sidewalls of the first floating gate 112a and the second floating gate 112b thereby forming the spacer dielectric 210. The term "anisotropic etching" may refer to an etching process that is directional in nature.

FIG. 5 is a cross-section view of a partially completed nonvolatile memory device array 100 taken along section line A-A' of FIG. 1A after formation of a source region 106, a drain region 108 and a substrate contact 116, according to an embodiment of the disclosure. Referring to FIG. 5, the source 106 and the drain 108 regions may be formed by doping an upper surface of the active regions 110a and 110b with a suitable dopant such as phosphorus (P), arsenic (As) or antimony (Sb) to form an n$^+$ doped region adjacent to a first side of the first floating gate 112a and the second floating gate 112b and to a second side of the first floating gate 112a and the second floating gate 112b opposite to the first side, respectively. The substrate contact 116 may be formed by doping an upper surface of the first active region 110a or the second active region 110b with a suitable dopant, for example boron (B) or boron fluoride (BF$_2$) to form a p$^+$ doped region adjacent to an isolation structure 118.

FIG. 6 is a cross-section view of a nonvolatile memory device array 100 taken along section line A-A' of FIG. 1A after formation of a first capacitor 168, according to an embodiment of the disclosure. Referring to FIG. 6, a silicide layer 152 may be formed over the source 106, the drain 108 and the first floating gate 112a and the second floating gate 112b. In another embodiment, the source 106 and the drain 108 may be partially silicided. The formation of the silicide layer 152 is well known in the art and will not be further elaborated upon. An interlayer dielectric (ILD) layer 156a may be formed over the first active region 110a, the second active region 110b, the first floating gate 112a, the second floating gate 112b and the isolation structure 118. The formation of the interlayer dielectric layer 156a may include depositing a layer of suitable insulating dielectric material, for example, silicon dioxide (SiO$_2$) by a suitable deposition process such as atomic layer deposition (ALD), physical vapor deposition (PVD), chemical vapor deposition (CVD) or any other suitable deposition processes. A contact pillar 138 may be formed in the interlayer dielectric layer 156a over the first floating gate 112a and the second floating gate 112b. The formation of the contact pillar 138 may include forming a via opening in the interlayer dielectric layer 156a by conventional photoresist process followed by a wet or dry etch process. A layer of suitable conducting material, for example tungsten (W) or copper (Cu) may be deposited in the via opening and over a top surface of the interlayer dielectric layer 156a by ALD, PVD, CVD or any other suitable deposition processes. A suitable planarization process, for example chemical mechanical planarization (CMP), may be used to remove a portion of the tungsten layer from the top surface of the interlayer dielectric layer 156a leaving behind another portion of the tungsten layer in the via opening thereby forming the contact pillar 138.

A first capacitor 168 may be formed over the contact pillar 138 and the interlayer dielectric 156a. The formation of the first capacitor 168 may include depositing a first layer of suitable conducting material, for example tantalum (Ta) or titanium nitride (TiN) over the interlayer dielectric layer 156a and over the contact pillar 138 by ALD, CVD, PVD, or any other suitable deposition processes. A layer of suitable insulating dielectric material, for example silicon nitride ($Si_3N_4$), hafnium oxide ($HfO_2$) or aluminum oxide ($Al_2O_3$) may be deposited over the first tantalum layer by ALD, CVD, PVD or any other suitable deposition processes. A second layer of suitable conducting material, for example tantalum (Ta) or titanium nitride (TiN) may be deposited over the silicon nitride layer by ALD, CVD, PVD or any other suitable deposition processes. The first tantalum layer, the silicon nitride layer and the second tantalum layer may be patterned by a conventional photoresist process followed by a wet etch or dry etch to form the first electrode 126, the dielectric layer 132 and the second electrode 128 of the first capacitor 168, respectively. An interlayer dielectric layer 156b may be formed over the first capacitor 168 and over the interlayer dielectric layer 156a and a contact pillar 150 may be formed over the second electrode 128 of the first capacitor 168 for connection to an external input terminal. Although not shown, a contact pillar may be formed over the source 106, the drain 108 or the substrate contact 116 to provide electrical coupling to external input terminals.

Figure 7:
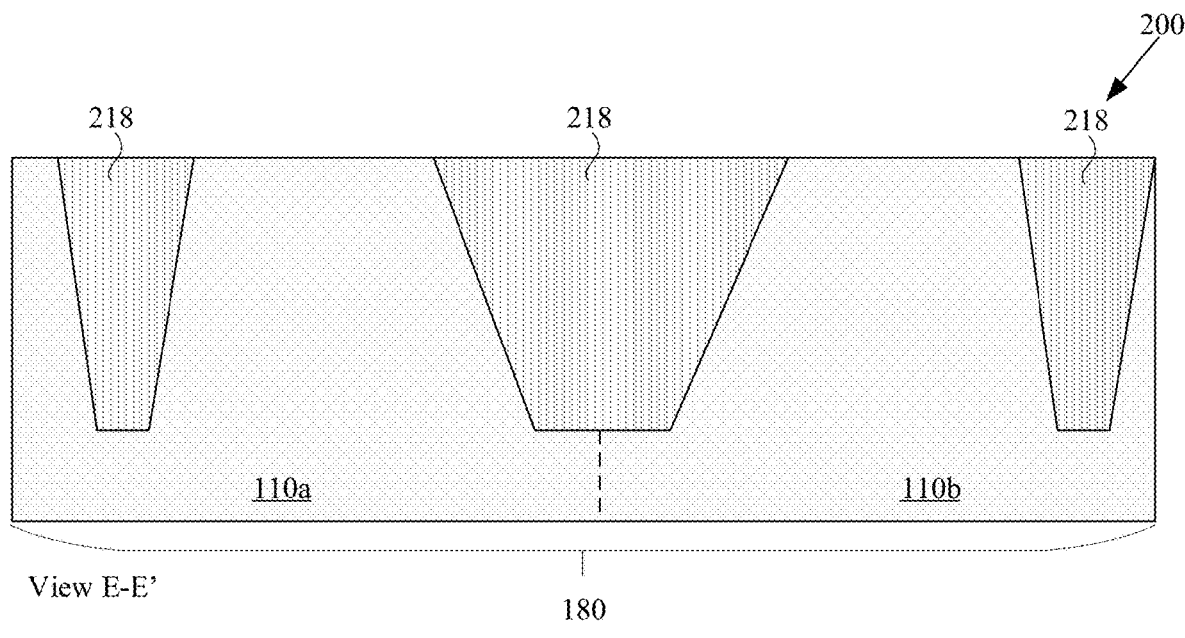
FIGS. 7 to 10 illustrate a fabrication process flow for the array of nonvolatile memory devices illustrated in FIG. 2A, according to further embodiments of the disclosure.

FIGS. 7 to 10 illustrate a fabrication process flow for the array of nonvolatile memory devices 200 illustrated in FIG. 2A, according to further embodiments of the disclosure. FIG. 7 is a cross-section view of a partially completed nonvolatile memory device array 200 taken along section line E-E' of FIG. 2A, according to an embodiment of the disclosure. Referring to FIG. 7, a semiconductor substrate 180 may be provided. An isolation structure 218 may be formed in the semiconductor substrate 180. A first active region 110a and a second active region 110b may be formed adjacent to the isolation structure 218. The formation of the isolation structure 218, the first active region 110a and the second active region 110b is similar to the formation of the isolation structure 118, the first active region 110a and the second active region 110b, respectively, as illustrated in FIG. 3.

Figure 8:
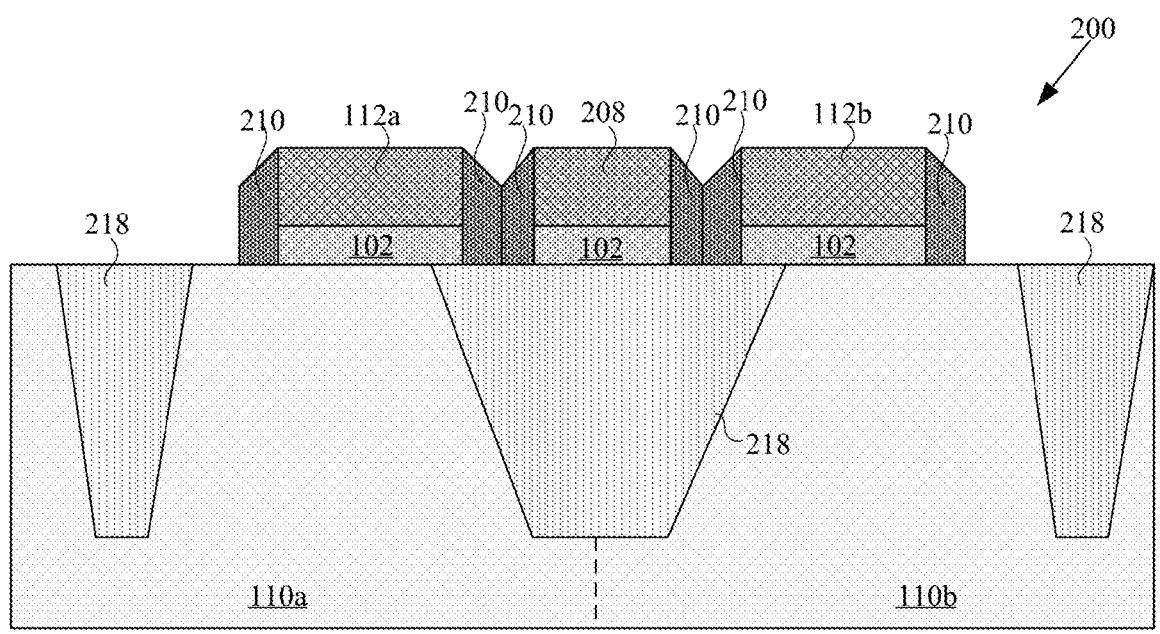

FIG. 8 is a cross-section view of a partially completed nonvolatile memory device array 200 taken along section line E-E' of FIG. 2A after formation of a dielectric layer 102, a first floating gate 112a, a second floating gate 112b, a first electrode 208 of a second capacitor and a spacer dielectric 210, according to an embodiment of the disclosure. The formation of the dielectric layer 102 may include depositing a layer of suitable dielectric material, for example silicon dioxide, over the first active region 110a, over the second active region 110b and over the isolation structure 218. A layer of polysilicon may be deposited over the silicon dioxide layer followed by doping with a suitable n-type dopant, for example phosphorus. The doped polysilicon layer and the silicon dioxide layer may be patterned by a conventional photoresist process followed by a wet etch or dry etch to form the first floating gate 112a, the second floating gate 112b, the first electrode 208 of the second capacitor between the first floating gate 112a and the second floating gate 112b and the dielectric layer 102, respectively. The formation of the first floating gate 112a, the second floating gate 112b and the first electrode 208 of the second capacitor between the first floating gate 112a and the second floating gate 112b may be done in the same process and from the same doped polysilicon layer.

A spacer dielectric 210 may be formed over sidewalls of the first floating gate 112a, the second floating gate 112b and the first electrode 208 of the second capacitor. The formation of the spacer dielectric 210 may include depositing a suitable dielectric layer, for example silicon dioxide, over the first floating gate 112a, the first electrode 208 of the second capacitor, the second floating gate 112b, the first active region 110a and the second active region 110b. An anisotropic etching process may be used to remove the silicon dioxide layer from a top surface of the first floating gate 112a, the first electrode 208 of the second capacitor, the second floating gate 112b, the first active region 110a and the second active region 110b leaving behind the silicon dioxide layer over sidewalls of the first floating gate 112a, the first electrode 208 of the second capacitor and the second floating gate 112b thereby forming the spacer dielectric 210.

Figure 9:
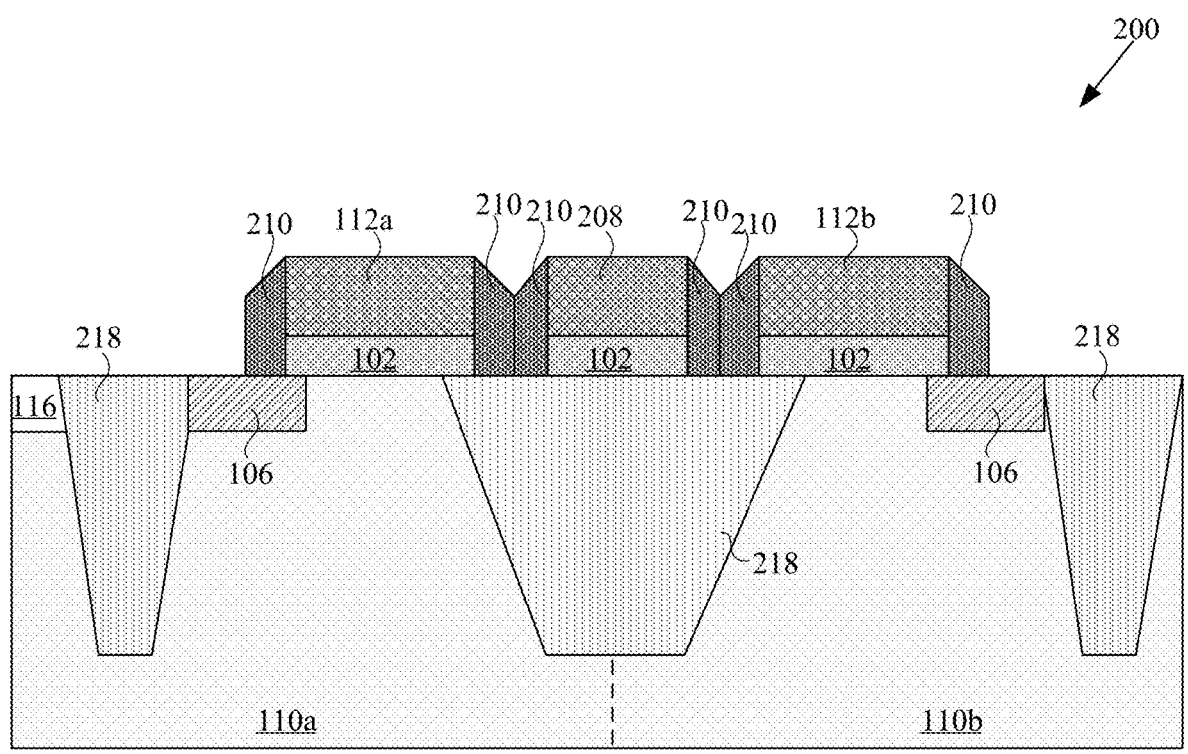

FIG. 9 is a cross-section view of a partially completed nonvolatile memory device array 200 taken along section line E-E' of FIG. 2A after formation of a source 106 and a substrate contact 116, according to an embodiment of the disclosure. The formation of the source 106 may include doping an upper surface of the first active region 110a and the second active region 110b adjacent to a side region of the first floating gate 112a and the second floating gate 112b with a suitable dopant, for example phosphorus, to form an n+ region. Although not shown, a drain 108 may be formed adjacent to a side of the first floating gate 112a and to a side of the second floating gate 112b opposite to the source 106. The formation of the substrate contact 116 is similar to the formation of the substrate contact 116 illustrated in FIG. 6.

Figure 10:
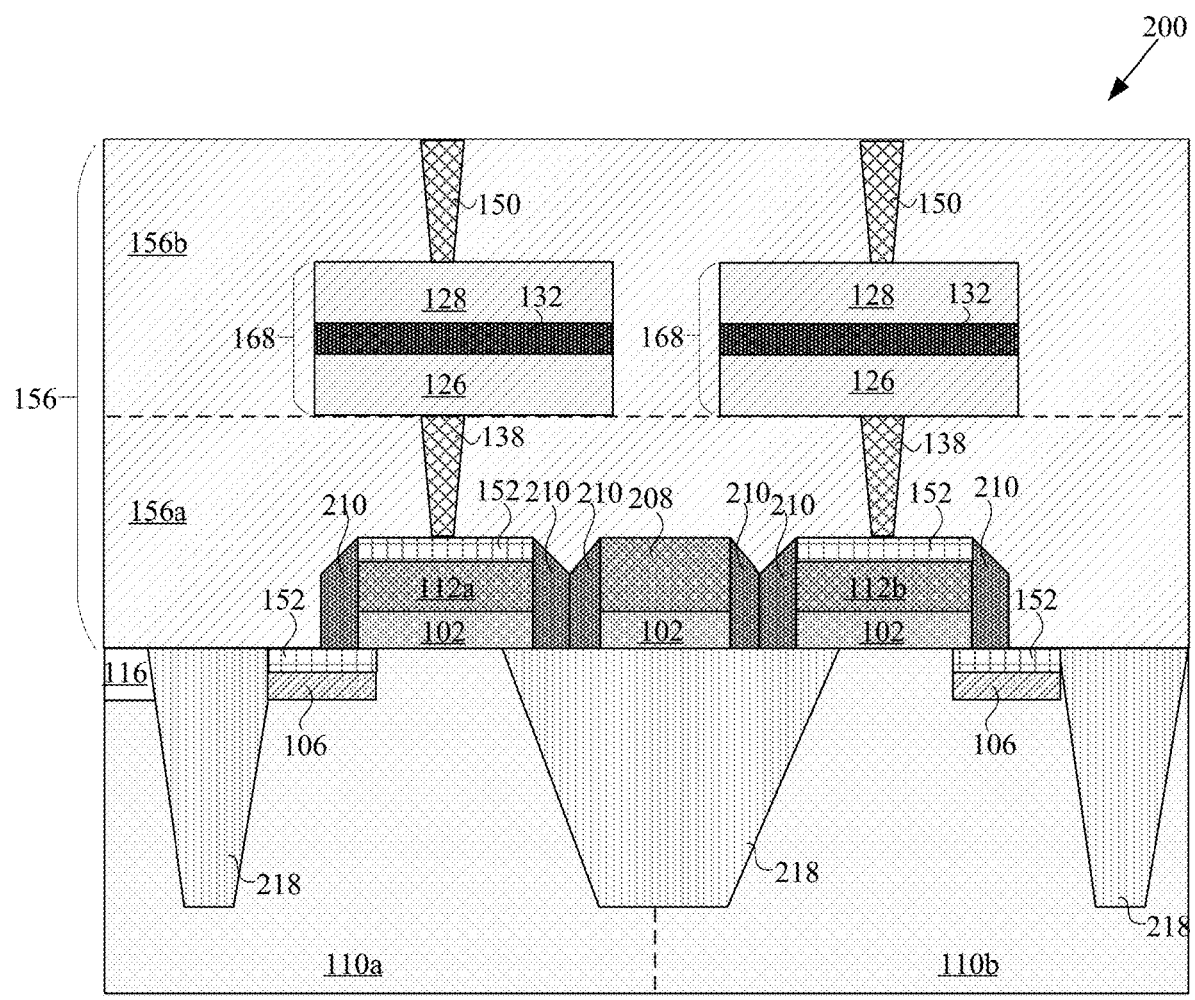

FIG. 10 is a cross-section view of a nonvolatile memory device array 200 taken along section line E-E' of FIG. 2A after formation of an interlayer dielectric layer 156, a contact pillar 138, a first capacitor 168 and a contact pillar 150, according to an embodiment of the disclosure. Referring to FIG. 10, an interlayer dielectric layer 156a may be formed over the first active region 110a, over the first floating gate 112a, over the first electrode 208 of the second capacitor, over the second floating gate 112b and over the second active region 110b. A contact pillar 138 may be formed in the interlayer dielectric layer 156a over the first floating gate 112a and over the second floating gate 112b. The formation of the contact pillar 138 may include forming an opening in the interlayer dielectric layer 156a over the first floating gate 112a and over the second floating gate 112b followed by depositing a suitable metal, for example, tungsten, into the opening to thereby form the contact pillar 138. A first capacitor 168 may be formed over the contact pillar 138 and over the interlayer dielectric layer 156a. The first capacitor 168 is electrically coupled to the first floating gate 112a and to the second floating gate 112b by the contact pillar 138. The formation of the first capacitor 168 is similar to the formation of the first capacitor 168 illustrated in FIG. 6. The first capacitor 168 may be separated from the first electrode 208 of the second capacitor by the interlayer dielectric layer 156a. An interlayer dielectric layer 156b may be formed over the first capacitor 168 and over the interlayer dielectric layer 156a. A contact pillar 150 may be formed over the first capacitor 168 to provide an electrical coupling between the first capacitor 168 to an external input terminal. Although not shown, a contact pillar may be formed over the first electrode 208 of the second capacitor, over the source 106 and over the substrate contact 116 for connection to an external input terminal.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A nonvolatile memory device comprising:
   an active region surrounded by an isolation structure;
   a floating gate having a first end, a second end opposite to the first end, a middle portion between the first end and the second end, a first side adjacent to the middle portion and a second side opposite to the first side, wherein the middle portion is over the active region, and the first end and the second end of the floating gate are over the isolation structure;
   a dielectric layer between the floating gate and the active region, wherein at least a portion of the dielectric layer is over the isolation structure;
   a first doped region in the active region adjacent to the first side of the floating gate and a second doped region in the active region adjacent to the second side of the floating gate;
   a first capacitor over the floating gate, the first capacitor comprising a first electrode and a second electrode, and a capacitor dielectric between the first electrode and the second electrode, wherein the first electrode of the first capacitor is electrically coupled to the floating gate; and
   contacts arranged over the first doped region, the second doped region and the second electrode of the first capacitor, wherein the contacts couple the first doped region, the second doped region and the second electrode of the first capacitor to input terminals.

2. The nonvolatile memory device of claim 1, wherein an area of the first capacitor is at least equal to an area of the floating gate.

3. The nonvolatile memory device of claim 1, wherein an area of the first capacitor is larger than an area of the floating gate.

4. The nonvolatile memory device of claim 1 further comprising:
   a second capacitor, wherein a first electrode of the second capacitor is directly above the isolation structure and adjacent to the floating gate.

5. The nonvolatile memory device of claim 4, wherein a second electrode of the second capacitor comprises the floating gate.

6. The nonvolatile memory device of claim 5 further comprising:
   a spacer dielectric between the first electrode of the second capacitor and the second electrode of the second capacitor.

7. The nonvolatile memory device of claim 4, wherein the first capacitor partially overlaps with the first electrode of the second capacitor.

8. The nonvolatile memory device of claim 7 further comprising:
   an insulating layer separating the first capacitor from the first electrode of the second capacitor.

9. The nonvolatile memory device of claim 1, wherein the active region comprises a p-well region.

10. The nonvolatile memory device of claim 1, wherein the first doped region is a source region and the second doped region is a drain region.

11. An array of nonvolatile memory devices comprising:
   a first active region, a second active region and an isolation structure surrounding each active region, wherein a portion of the isolation structure is between the first active region and the second active region;
   a first array of floating gates and a second array of floating gates, each floating gate having a first end, a second end opposite to the first end, a middle portion between the first end and the second end, a first side adjacent to the middle portion and a second side opposite to the first side, wherein the middle portion of each floating gate from the first array is arranged over the first active region, the middle portion of each floating gate from the second array is arranged over the second active region, and the first end and the second end of each floating gate are over the isolation structure;
   a dielectric layer between each floating gate from the first array and the first active region, and between each floating gate from the second array and the second active region, wherein at least a portion of the dielectric layer is over the isolation structure;
   a first doped region in each active region adjacent to the first side of each floating gate and a second doped region in each active region adjacent to the second side of each floating gate; and
   a first capacitor over each floating gate, the first capacitor comprising a first electrode and a second electrode, and a capacitor dielectric between the first electrode and the second electrode, wherein the first electrode of the first capacitor is electrically coupled to each floating gate; and
   contacts arranged over the first doped region, the second doped region and the second electrode of the first capacitor, wherein the contacts couple the first doped region, the second doped region and the second electrode of the first capacitor to input terminals.

12. The array of nonvolatile memory devices of claim 11, wherein an area of the first capacitor is at least equal to an area of each floating gate.

13. The array of nonvolatile memory devices of claim 11 further comprising:
a second capacitor, wherein a first electrode of the second capacitor is arranged over the portion of the isolation structure between the first active region and the second active region and is adjacent to the floating gates.

14. A method of fabricating a nonvolatile memory device comprising:
forming an active region surrounded by an isolation structure;
forming a floating gate having a first end, a second end opposite to the first end, a middle portion between the first end and the second end, a first side adjacent to the middle portion and a second side opposite to the first side, wherein the middle portion of the floating gate is over the active region, and the first end and the second end of the floating gate are over the isolation structure;
forming a dielectric layer between the floating gate and the active region, wherein at least a portion of the dielectric layer is over the isolation structure;
forming a first doped region in the active region adjacent to the first side of the floating gate;
forming a second doped region in the active region adjacent to the second side of the floating gate;
forming a first capacitor over the floating gate, the first capacitor comprising a first electrode and a second electrode, and a capacitor dielectric between the first electrode and the second electrode, wherein the first electrode of the first capacitor is electrically coupled to the floating gate; and
forming contacts over the first doped region, the second doped region and the second electrode of the first capacitor, wherein the contacts couple the first doped region, the second doped region and the second electrode of the first capacitor to input terminals.

15. The method of claim 14, wherein forming the active region surrounded by the isolation structure further comprises:
forming an isolation structure in a substrate; and
forming the active region in the substrate, wherein the active region is surrounded by the isolation structure.

16. The method of claim 14, wherein forming the floating gate further comprises:
forming a polysilicon layer over the active region and over the isolation structure; and
patterning the polysilicon layer to form the floating gate having the first end, the second end opposite to the first end, and the middle portion between the first end and the second end, wherein the middle portion is over the active region, and the first end and the second end of the floating gate are over the isolation structure.

17. The method of claim 16 further comprising:
patterning the polysilicon layer to form a first electrode of a second capacitor adjacent to the floating gate and over the isolation structure.

18. The method of claim 17 further comprising:
forming a spacer dielectric adjacent to a sidewall of the floating gate and to a sidewall of the first electrode of the second capacitor.

19. The method of claim 14, wherein forming the first capacitor further comprises:
forming an insulating layer over the active region, over the floating gate and over the isolation structure;
forming a contact pillar in the insulating layer over the floating gate; and
forming the first electrode of the first capacitor over the contact pillar and over the insulating layer.

20. The nonvolatile memory device of claim 1, wherein the first end and the second end of the floating gate are directly above the isolation structure.

* * * * *